United States Patent
Fouli

(10) Patent No.: US 7,480,169 B2
(45) Date of Patent: Jan. 20, 2009

(54) IDEAL CMOS SRAM SYSTEM IMPLEMENTATION

(76) Inventor: Bassem Mohamed Fouli, 50 Ahmed elzayyat st., Dokki, Giza (EG) 12311

( * ) Notice: Subject to any disclaimer, the term of this patent is extended or adjusted under 35 U.S.C. 154(b) by 0 days.

(21) Appl. No.: 11/585,076

(22) Filed: Oct. 24, 2006

(65) Prior Publication Data
US 2007/0035989 A1 Feb. 15, 2007

(51) Int. Cl.
*G11C 11/00* (2006.01)
(52) U.S. Cl. .................. 365/154; 365/156; 365/189.09
(58) Field of Classification Search ................ 365/154, 365/156, 226, 206, 189.09
See application file for complete search history.

(56) References Cited

U.S. PATENT DOCUMENTS 5,610,870 A * 3/1997 Choi .......................... 365/226
6,970,374 B2 * 11/2005 Lin ............................ 365/154

* cited by examiner

Primary Examiner—Gene N. Auduong

(57) ABSTRACT

CMOS static RAM based memory system, which reduces power consumption and increases operation speed by disconnecting cell power supply during write operation. Additional transistors are provided between Sources of the SRAM cell transistors and supply voltage or ground voltage connection. These are switched off during write, in order to interrupt a dynamic current path to supply or to ground. Additionally, implementation of inductive elements into the power supply can help to reduce current spikes during switching.

7 Claims, 2 Drawing Sheets

_US 7,480,169 B2_

IDEAL CMOS SRAM SYSTEM IMPLEMENTATION

This patent application is referred to the international application PCT/IB2005/001931 filed on Jun. 23, 2005, together with amendments according to PCT rule 52 & article 28.

TECHNICAL FIELD

This design is a digital CMOS SRAM cell based implementation of a static memory system, at the level of electronic implementation.

BACKGROUND ART

The background art is the CMOS memory cell, where the Pull-up FETs were coupled to the Supply line directly, and the Pull-down FETs were coupled to Ground directly, the advantages of this model were:

1—Every point in a memory cell was a strong point, due to absence of resistive components, so every point inside the memory cell was coupled to either Supply line or Ground via a very low resistance (The FET Drain to Source resistance), this led to high immunity of a memory cell against any interference when used at high operating frequencies.

2—The absence of resistive components in the dynamic current path led to a very fast response during writing process where FETs switch ON and OFF very fast.

The main disadvantage for this model was due to its advantages where the presence of strong points everywhere in the memory cell made the introduction of an external signal to any of those points a trigger for a very high dynamic current which occurs due to the low resistance—Source to Drain resistance of a FET in "On" status—between the Supply/Ground points and the Source of the introduced Input signal.

BRIEF SUMMARY OF INVENTION

As mentioned above in the "Background art section" The barrier between the CMOS SRAM cell and integrability was the short circuit occurrence during writing process between the Supply/Ground points and the Input points.

The solution I introduce here is based on the approach of omitting the Supply & Ground points during the writing process.

The Supply & Ground points should be omitted for all the changing cells during their transient status only, so that any dynamic current occurs will be due to the charges accumulated on the parasitic capacitances of FETs, which will lead to slight heat emission where the mentioned parasitic capacitances will be in the range of fF (Femto Farad), and in case of negligible resistance in the current path, the resultant current will occur only for fSECs (Femto Seconds), which will result in a negligible heat emission.

The suggested mean of temporary omission of Supply and Ground points is by coupling the Pull-up FETs of every n cell/s to supply line via 2 switch select FETs in parallel and coupling the Pull-down FETs of every n cell/s to Ground via 2 other switch select FETs in parallel, all the four switch select FETs will be called "Supply switch select FETs" and those supply switch select FETs will be normally ON when no CAS or RAS signals are introduced, while a part of those supply switch select FETs will be switched OFF during writing process so as to isolate only n memory cells from Ground and Supply points at a time.

The last point to be mentioned in this section is related to the CAS & RAS signals, those signals will be introduced in new forms rather than their old forms to the enable select FETs per cell for all the cells included in the writing process and to the supply switch select FETs common between every n memory Cell/s, so each of those signals will be divided into 4 different time frames, this point will be discussed later in the drawing description section.

Figure 1:
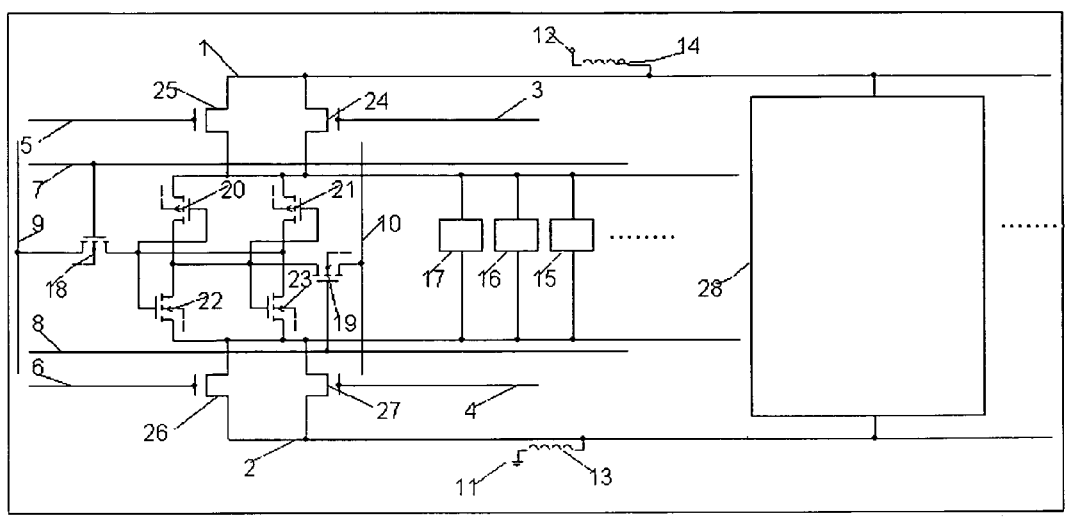
FIG. 1 shows a proposed implementation for the system.

The FETs 18, 19, 20, 21, 22 & 23 form a CMOS SRAM cell with no additional components where 20 & 21 are the pull-up FETs, 22 & 23 are the pull-down FETs, 18 & 19 are the Input/Output switch select FETs, FETs 24 & 25 couple between the pull-up FETs 20&21 and the memory system on chip supply line 1, FETs 26 & 27 couple between the pull-down FETs 22 & 23 and the memory system on chip Ground line 2, the coil 13 can be added so as to couple between the on chip Ground line 2 and the external Ground of the power supply 11, and the coil 14 can be added so as to couple between the on chip supply line 1 and the external supply line of the power supply 12, both coils are put so as to match the average effective capacitance in the current path between the external supply 12 and Ground 11 respectively from a side and the Input/Output lines 9 &10 from the other side at the operating frequency of the memory system, FETs 24, 25, 26 & 27 are normally ON so that the pull-up FETs are coupled to the on chip supply line 1 and the pull-down FETs are coupled to the on chip Ground line 2 via a low resistance (Source to Drain resistance of a FET in ON status).

Note1: The on chip supply and ground lines are a part of the memory chip and should be implemented together with the memory groups and control lines within the chip while the external supply and ground lines are the feeding lines from the power supply that will either be a part of the chip or the power supply depending on the nature and position of the implemented coils.

Note: The introduction of any coil to the memory system is optional because the frequency response of this memory system is already high, and may be higher than the available operating frequencies of the processing system to which this memory system is added.

Note2: The FETs 24, 25, 26 & 27 are common between more than a single memory cell, because during the writing process in a memory system, logic change occurs in a whole memory word or n words at a time, where all the cells included in those n words have the same CAS & RAS address lines.

The aggregate of cells included in an N words together with their Supply switch select FETs are dealt with as a single block i.e. Block 28.

DETAILED DESCRIPTION OF THE INVENTION

Now it is the time to speak about how the system operates according to the control signals to be introduced to each of the lines 3, 4, 5, 6, 7 & 8.

For simplicity, will assume all the switch select FETs like 18, 19, 24, 25, 26 & 27 are all NFETs.

Figure 2:
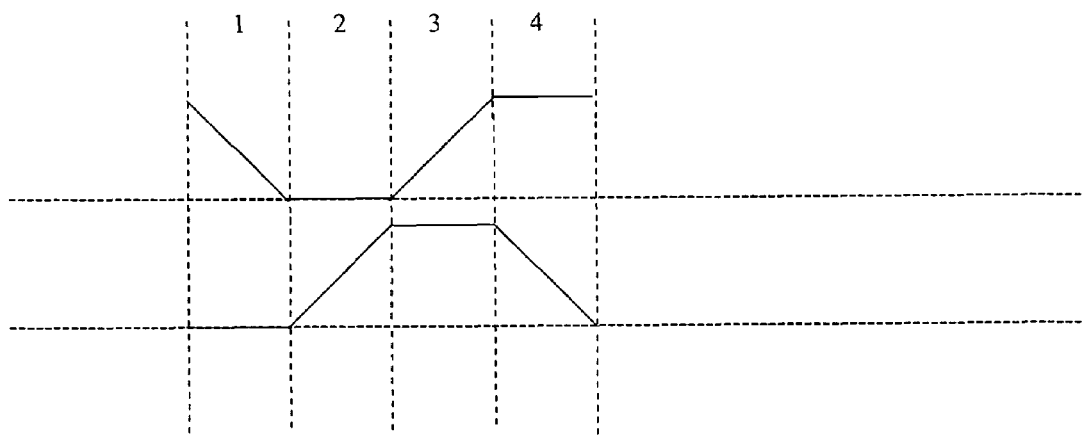

FIG. 2 shows the CAS/RAS positive duty cycles (During the writing process) divided into 4 time frames, and each of the signals to be applied to the 6 control lines 3, 4, 5, 6, 7 & 8 is illustrated during the 4 time frames 1, 2, 3 & 4.

The upper signal represents the positive duty cycle of the signal introduced to lines 3, 4, 5 & 6, the transient response is given a complete time frame so as to take into consideration any possible synchronization or delay issue between CAS & RAS signals.

The lower signal represents the positive duty cycle of the signal introduced to lines 7 & 8, the transient response is given a complete time frame so as to take into consideration any possible synchronization or delay issue between CAS & RAS signals.

Note: Those resultant signals can be obtained by multiplying the original CAS & RAS signals by other new signals that can develop the resultant required signals illustrated in FIG. 2

Note2: Practically a time frame should be calculated so that at its beginning the signals are guaranteed to be in their initial statuses, while at its end the signals are guaranteed to be in their final statuses, taking in consideration any delay or synchronization issues.

Note3: Practically the 4 time frames 1, 2, 3 & 4 are not equal but here we can assume they are equal for the purpose of simplicity.

Note4: The highest values for both the upper and the lower signals are supposed to be enough to switch the FETs to which they are introduced ON, while the lowest values for both the upper and lower signals are supposed to be enough to switch the FETs to which they are introduced OFF.

For simplicity, the highest logic 1 will be assumed to have a value Vcc, while the logic 0 will be assumed to have a value equals ground.

1—During the first time frame (1), the Gates of the FETs 24, 25, 26 & 27 are subjected to an OFF signal via lines 3, 4, 5 & 6 to break the connection between the Supply/Ground points and the SRAM cells selected to change their statuses, while no change is introduced to the lines 7 or 8 yet.

2—During the second time frame (2), the Gates of FETs 18 & 19 are subjected to an ON signal coming from lines 7 & 8, to allow the Voltage on the lines 9 & 10 to be transferred to the Gates & Drains of the Pull-up & Pull-down FETs, in this stage we need to study the status of the Pull-up and Pull-down FETs of a cell.

Lets take the case a Vcc signal is introduced though Line 9 and a Ground Signal introduced through line 10, in this case the NFET 22 has a Vcc on its Gate while having a Ground on its Drain, this should be enough to drive it ON and thus its Source will acquire a Ground signal too introduced from its Drain, also PFET 21 will have a Ground signal on its Gate while it has a Vcc signal on its Drain, and this also should be enough for it to be driven ON, and thus a Vcc signal will be introduced to its Source via its Drain, but NFET 23 will have a Vcc signal on its Drain while both its Gate and Source have a Ground signal, this condition is enough to keep it OFF, also the PFET 20 will have a Ground signal on its Drain while both its Gate and Source have a Vcc signal, this condition is also enough to keep it OFF, so all the Pull-up & Pull-down FETs acquired their final status during the second time frame and they need to keep them after the I/P signals are not maintained, so lets go to the third time frame.

3—During the third time frame (3), the lines 7 & 8 maintain their statuses while the lines 3, 4, 5 & 6 begin to acquire a Vcc signal to bring the supply switch FETs ON, and thus returning to their initial statuses and the memory cells are fed normally to keep the logic they carry.

4—During the forth time frame (4), lines 7 & 8 get back to their initial values so as to disable the Input/Output switch FETs and thus returning to static status, while the lines 3, 4, 5 & 6 are already back to their original statuses and they face no change during this time frame.

What is claimed is:

1. The memory system hereby comprises a plurality of SRAM memory groups (28) arranged in rows and columns and formed on a substrate assembly comprising at least one semiconductor layer;

at least one memory group (28) is coupled to both an internal supply line (1) and an internal ground line (2) where the said internal supply line (1) and the said internal ground line (2) are implemented on a chip together with the said memory group/s (28);

a memory group (28) comprises one or more SRAM memory cells (15, 16, 17) together with supply switch select FETs (24, 25, 26, 27);

an SRAM memory cell comprises two cascaded inverters together with two switch select FETs (18 and 19), where each of the said inverters output is coupled to the other inverter input, wherein each of the said inverters comprises a PFET (20, 21) with its drain coupled to the drain of an NFET (22, 23) and both drains are coupled to the output terminal of the inverter they constitute, the said NFET gate is coupled to the said PFET gate, and both are coupled to the input terminal of the inverter they constitute;

the input terminal of an inverter stage is coupled to the first terminal of a switch select FET (18) while the input of the other inverter stage is coupled to the first terminal of another switch select FET (19);

two or more of the said Supply switch select FETs (24, 25) are formed so that their Drains are coupled together while their sources are coupled together, the aggregate of Source to Drain junctions couple between the sources of the PFETs (20, 21) of one or more of the said SRAM memory cells and the said internal supply line (1), while two or more of the said Supply switch select FETs (26, 27) are formed so that their Drains are coupled together while their Sources are coupled together, the aggregate of Source to Drain junctions couple between the Sources of the NFETs (22, 23) of one or more of the said SRAM memory cells and the said internal ground line (2), and the memory system comprises a plurality of control lines wherein the Gate of each of the said supply switch select FETs (24, 25, 26, 27) is connected to a separate control line (3, 4, 5, 6) where each signal applied to a control line (3, 4, 5, 6) is used to specify a spatial address selection, being a row address, a column address, or any other dimensional address, which enables a random access of one or more memory cells, and each of the supply switch select FETs (24, 25, 26, 27) operates in either "ON" status during which its source to drain resistance is intended to be as low as possible aiming at keeping the data storing points inside memory cells connected to strong supply nodes, or in "OFF" status during which its source to drain resistance is intended to be as high as possible so as to Omit connectivity between the memory cells and both the internal Supply line (1) and the internal Ground line (2) for the changing cells during a write cycle, and to be insufficient to keep the stored data inside memory cells, and data is entered via both switch select FETs (18, 19) of a memory cell simultaneously during a write cycle, where a bit is entered via a first switch select FET while its complement is entered via the second switch select FET, and each terminal of each FET, PFET, NFET is coupled to a corresponding wiring line formed on a chip.

2. The memory system according to claim 1 wherein the internal supply line (1) according to claim 1 is coupled directly to an external higher fixed potential supply line (12).

3. The memory system according to claim 1 wherein the internal supply line (1) is coupled to an external higher fixed potential supply line (12) via an inductive element (14) which value is calculated so as to match the average effective value of the parasitic capacitance between the external Supply line of higher fixed potential (12) and the Input/output bit lines (9, 10), so that the transient time of charge/discharge of the said parasitic capacitance in this claim during write process is decreased and accordingly the mean value of the dynamic current per write cycle.

4. The memory system according to claim 1 wherein the internal ground line (2) is coupled directly to an external ground line (11).

5. The memory system according to claim 1 wherein the ground line (2) is coupled to an external ground line (11) via an inductive element (13) which value is chosen so as to match the average effective value of the parasitic capacitance between the external ground line (11) and the Input/output bit lines (9, 10) so that the transient time of charge/discharge of the said parasitic capacitance in this claim during write process is decreased and accordingly the mean value of the dynamic current per write cycle.

6. A "supply switch select FET" according to claim 1 is a PFET.

7. A "supply switch select FET" according to claim 1 is an NFET.

* * * * *